(12) United States Patent
Fyson et al.

(10) Patent No.: US 7,217,504 B2
(45) Date of Patent: May 15, 2007

(54) METHOD OF IMAGING

(75) Inventors: John R. Fyson, Hackney (GB); John M. Higgins, Pinner (GB)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/215,497

(22) Filed: Aug. 30, 2005

(65) Prior Publication Data

US 2006/0051705 A1 Mar. 9, 2006

(30) Foreign Application Priority Data

Sep. 3, 2004 (GB) ................. 0419567.3

(51) Int. Cl.
*G03C 5/56* (2006.01)
(52) U.S. Cl. .................................... 430/334
(58) Field of Classification Search ................ 430/334
See application file for complete search history.

(56) References Cited

U.S. PATENT DOCUMENTS 4,360,548 A * 11/1982 Skees et al. ................ 428/29

2005/0093948 A1 * 5/2005 Morris et al. ............... 347/100

FOREIGN PATENT DOCUMENTS

| EP | 0 822 096 | 2/1998 |
|----|-----------|--------|
| JP | 2002-023343 | 1/2002 |
| WO | WO 01/070508 | 9/2001 |

* cited by examiner

*Primary Examiner*—Hoa Van Le
(74) *Attorney, Agent, or Firm*—Paul A. Leipold

(57) ABSTRACT

The application, according to a desired image, of an absorbance controlling composition to a receiver having an imaging layer comprising a radiation absorbing component, such as a dye or pigment, with spectral absorbance properties susceptible to change on treatment with the absorbance controlling composition provides a method of imaging by which a desired image may be formed on the receiver, for example by jetting a solution of the absorbance controlling composition onto the receiver.

23 Claims, 5 Drawing Sheets

METHOD OF IMAGING

FIELD OF THE INVENTION

The present invention relates to the field of imaging and particularly to imaging applications involving high-density colour or monochrome images. More particularly, the present invention relates to the formation of high-density, high-resolution images, especially on a transparent support, by the application of a solution to a dye-coated receiver, as a method of printing. The invention is further concerned with a solution and a receiver for use in such a method.

BACKGROUND OF THE INVENTION

Traditional ink-jet systems involve jetting a solution of ink onto a receiver according to a desired positive image. For example, where the desired image requires light absorbance of a particular wavelength at a particular point, an ink having a dye capable of absorbing at that wavelength is typically applied to a receiver at a corresponding point to effect the desired absorbance. Accordingly, an image is formed by applying inks having dyes or pigments of known absorbance to a receiver to form an image with a desired spectral 'footprint' corresponding to the spectral properties of the dyes applied at the various points on the receiver. For many applications, this method is effective at accurately representing an image.

A problem with using ink-jet printing, particularly when forming high-density and/or high-resolution images is that in order to achieve a high-density image, sufficient material, e.g. dye or pigment, must be present to absorb sufficient light. The absorption depends on the amount of the material and its inherent optical absorption coefficient, as defined by Beer's Law. Many dyes have a high molecular weight and the optical density per gram is not necessarily high. In order to get sufficient density using such dye-based inks, relatively large amounts of dye must be applied to the receiver. In ink-jet printing, images are formed by jetting dyes in inks. However, there is a limit to the concentration of a dye that can be included in an ink to be jetted, because the dye must pass through small ink-jet nozzles and therefore must be a stable solution or a fine suspension of particles suitable for jetting. So in many cases, such as in the forming of masks for use in printed circuit board manufacture, it is not possible to use ink-jet printing to form the mask in a single application. This problem can be overcome by laying down more than one layer of ink, but this increases the time required to form the desired image. Alternatively, the hole-size in the ink-jet head can be increased in order to increase the amount of ink that can be delivered at one time or to increase the concentration of dye that may be included in an ink, but this leads to a disadvantageous loss in resolution.

Problem to be Solved by the Invention

It is desirable to provide a method by which high-density images can be formed by using a simple jetting technique, which is quick and effective. It is further, desirable that such a technique be capable of providing high-resolution images.

Furthermore, it is desirable that printed circuit board masks may be formed by a simple, fast and efficient ink-jet printing method capable of forming high-density high-resolution images, for use in the manufacture of printed circuit boards.

It is still further desirable to provide a simple, fast, efficient and reliable method of generating hard copy medical or X-ray images from digitally stored images.

SUMMARY OF THE INVENTION

According to a first aspect of the present invention, there is provided a method of imaging comprising the steps of providing a receiver having at least one radiation absorbing component having pre-determined spectral absorbance properties susceptible to alteration to form an altered radiation absorbing component upon contact with at least one absorbance controlling composition and treating the receiver with an absorbance controlling composition according to a desired image whereby the spectral properties of the radiation absorbing component are altered such that the desired image is formed.

According to a second aspect of the invention, there is provided an imaging system comprising an absorbance controlling composition; a receiver having at least one radiation absorbing component having predetermined spectral absorbance properties susceptible to alteration to form an altered radiation absorbing component upon contact with the absorbance controlling composition; and a means for applying the absorbance controlling composition to the receiver according to a desired image, whereby application of the absorbance controlling composition to a position on the receiver causes the spectral absorbance properties of the radiation absorbing component at that position to be altered.

According to a third aspect of the invention, there is provided a receiver for use in imaging, said receiver comprising a support and a receiving layer, which receiving layer comprises a radiation absorbing component having predetermined spectral properties capable of being changed on contact with an absorbance controlling composition.

According to a fourth aspect of the invention, there is provided a method of manufacturing a receiver as defined above, which method comprises mixing or dispersing a dye or pigment with an aqueous solution or dispersion of an absorbant material, coating same onto a support and drying said coated support.

According to a fifth aspect of the invention, there is provided a solution comprising a complex of sulfur dioxide with a non-solid substituted or unsubstituted amine, said solution being suitable for use in imaging by applying an ink-jet printer to a receiver having a receiving layer coated in a material having certain spectral absorbance properties capable of being altered on treatment with a complex of sulfur dioxide with a non-solid substituted or unsubstituted amine.

According to a sixth aspect of the invention, there is provided a use of sulfur dioxide to alter the spectral absorbance properties of a dye on a receiver thereby generating an image.

According to a seventh aspect of the invention, there is provided a method of forming a mask for use in the manufacture of printed circuit boards, said method comprising treating a receiver according to a printed circuit board pattern with a absorbance controlling composition, wherein the receiver comprises a receiving layer which comprises a radiation absorbing component which causes the receiver to be substantially opaque and which has certain spectral absorbance properties susceptible to alteration on contact with said absorbance controlling composition, whereby the spectral absorbance properties of the radiation absorbing component on the receiver are correspondingly altered by the absorbance controlling composition causing the receiver to become transmissive according to the printed circuit board pattern.

According to an eighth aspect of the invention, there is provided a method of manufacturing a printed circuit board, said method comprising providing a mask made according to the method described in above, exposing a pre-sensitized printed circuit board substrate coated in a photoresist through the mask and processing said exposed printed circuit board substrate to form a printed circuit board having a desired track pattern.

Advantageous Effect of the Invention

By using the method of imaging of the present invention it is possible to form images using a high-resolution jetting means of delivery that may not have been appropriate to the application of inks, due to limitations in the physical properties of inks and the required concentrations of dyes and/or pigments required in inks to generate an image of the desired density. It is thereby possible to form higher resolution images via a fluid jetting system than were possible with traditional ink-jet methods.

Furthermore, a particular benefit of the present invention is apparent in the generation of high-density images, particularly high-resolution high-density images, such as printed circuit board masks or X-ray images. By applying a composition that alters the spectral absorbance properties of a radiation absorbing component present on a receiver, e.g. as a continuous coating, it is possible to generate a high-density image where the high-density portion of the image covers a major part of the receiver, without having to suffer a significant loss in resolution (by increasing the nozzle aperture) and without the delay of having to print the image several times to deliver the required quantity of dye as would be necessary by traditional ink-jet printing methods.

DETAILED DESCRIPTION OF THE INVENTION

Figure 1:
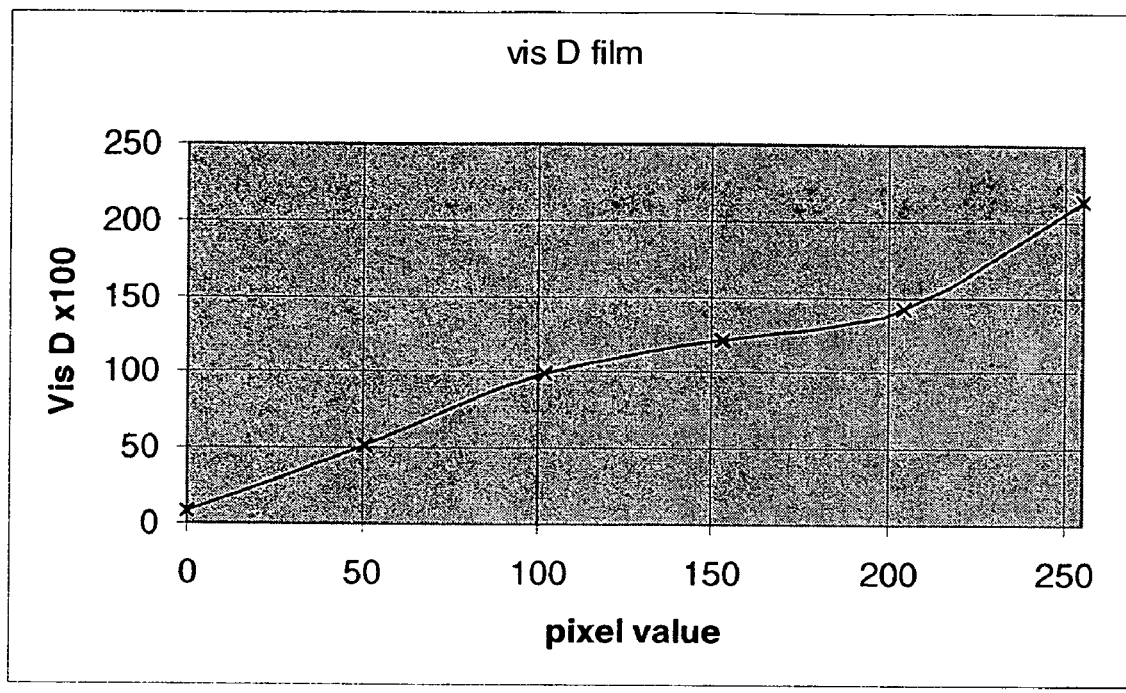
FIG. 1 shows a graph of pixel value against measured visible density for Solution 1 (of Example 2) applied to Receiver I (of Example 1) according to the Adobe Photoshop® wedge image of Example 3.

As mentioned above, the method of the invention is concerned with the treatment, with an absorbance controlling composition capable of altering the spectral absorbance properties of a radiation absorbing component, of a receiver comprising that component, preferably in continuous homogeneous coverage, such that the change in the spectral absorbance properties of the radiation absorbing component on contact with the absorbance controlling composition results in the formation of an image corresponding to a desired image. The method may typically be carried out using an imaging system according to the invention which comprises an absorbance controlling composition, a receiver having at least one radiation absorbing component having certain spectral properties which are capable of being altered to form an altered radiation absorbing component on contact with the absorbance controlling composition, and a means (e.g. an ink-jet printer) for applying the absorbance controlling composition to the receiver according to a desired image or pattern, whereby application of the composition to a position on the receiver causes the spectral properties of the radiation absorbing component at that position to be altered.

Preferably, the means for applying the absorbance controlling composition is a fluid-jet apparatus such as an ink-jet printer, which is capable of jetting a fluid in accordance with a desired image in response to digital data signals. Suitable such apparatus might include a continuous stream jetting apparatus or a drop-on-demand jetting apparatus.

The effect of altering the spectral properties of the radiation absorbing component, which is typically a dye or pigment, on the receiver, which, prior to the application of a solution of the absorbance controlling composition, preferably has a continuous even distribution of the radiation absorbing component across the receiving layer, is that an image may be visible, either by visible means or using a 'reader', depending upon the original and the altered spectral absorbance properties. Preferably, the magnitude of the change in the spectral absorbance properties of the radiation absorbing component corresponds to the amount of the active components of the absorbance controlling composition applied thereto, more preferably in a largely linear relationship, but optionally in a non-linear relationship depending upon the application and desired effect. If a non-linear relationship were to exist, it may be that the means for delivery, e.g. an ink-jet printer is calibrated accordingly or a computer program, which provides the delivery means' digital data signals, is calibrated accordingly. Preferably the radiation absorbing component and the absorbance controlling composition are chosen such that the spectral properties of the radiation absorbing component are changed from having a first absorbance within the visible spectrum to having a second absorbance within the visible spectrum (e.g. the dye or pigment changes colour on application of an absorbance controlling composition solution) or to having no absorbance within the visible spectrum (i.e. the colour disappears).

Alternatively, for certain applications, the radiation absorbing component may be chosen such that the spectral properties change from having a first absorbance, e.g. tending to 100% absorbance, in a non-visible part of the electromagnetic spectrum, such as at ultra-violet or infra-red wavelengths, to having a second absorbance, e.g. a reduced absorbance or zero absorbance, at that wavelength. In either case, depending upon the application, that change in spectral properties may render a receiver which is opaque at a particular wavelength (as a consequence of the presence of the radiation absorbing component) translucent or transmissive at that wavelength, the degree of which translucence or transmittance preferably corresponding to the amount of the absorbance controlling composition applied.

For certain applications, it is appropriate for the change in spectral absorbance to be visible, in which case the spectral properties of the radiation absorbing component may be highly absorbent to light across the visible spectrum.

Preferably, the method comprises application of a solution, especially a jettable solution, to a receiver. Any receiver capable of carrying an radiation absorbing component capable of having its spectral absorbance properties altered by the solution may be utilised. Typically, the receiver comprises a support and a receiving layer.

A support of the imaging system of the invention may be any suitable support, for example any support suitable for use as an ink-jet receiver. The support may be opaque or transparent. Examples of suitable supports include, for example, paper, resin coated paper such as Ektacolor® resin coated paper, film base such as an Estar® film support, acetate, polyethylene terephthalate (PET), a printing plate support, aluminium foil, latex-treated polyester or other suitable support. Preferred supports include Ektacolor® resin coated paper, an Estar® film support or an acetate.

Where the image to be formed is a reproduction of an X-ray image or a mask for use in manufacturing printed circuit boards, it is preferable that a transparent support is utilised.

The receiving layer preferably comprises an adsorbent material, such as a binder or a swellable polymer, and a radiation absorbing component, which may be, for example, a dye or pigment. The receiving layer may be a porous or non-porous media. The adsorbent material should be a material capable of carrying the radiation absorbing component present in the receiving layer, such as a swellable polymer material. The adsorbent material may be any suitable swellable polymer or any suitable binder, for example. Suitable polymers for use as the adsorbent material in the receiving layer, depending upon the nature of the radiation absorbing component, include, for example, one or more of naturally occurring hydrophilic colloids and gums such as gelatin, albumin, guar, xantham, acacia and chitosan and their derivatives, functionalised proteins, functionalised gums and starches, cellulose ethers and their derivatives, such as hydroxyethyl cellulose, hydroxypropyl cellulose and carboxymethyl cellulose, polyvinyl oxazoline and polyvinyl methyloxazoline, polyoxides, polyethers, poly(ethylene imine), poly(acrylic acid), poly(methacrylic acid), n-vinyl amides including polyacrylamide and polyvinyl pyrrolidone, polyethylene oxide and polyvinyl alcohol, its derivatives and copolymers. Preferably, the binder polymer is gelatin or polyvinyl alcohol, more preferably, polyvinyl alcohol.

The receiving layer may optionally comprise other components such as a mordant and/or a surfactant, particularly when the radiation absorbing component is a dye. Typical mordants that may be included are, for example, a cationic polymer, e.g. a polymeric quarternary ammonium compound, or a basic polymer, such as poly(dimethylaminoethyl)methacrylate, polyalkylenepolyamines, and products of the condensation thereof with dicyanodiamide, amine-epichlorohydrin polycondensates, divalent Group II and III metal ions, lecithin and phospholipid compounds or any suitable mordant that is capable of assisting with fixing a dye material transferred to it. Examples of such mordants include vinylbenzyl trimethyl ammonium chloride/ethylene glycol dimethacrylate, poly(diallyl dimethyl ammonium chloride), poly(2-N,N,N-trimethylammonium)ethyl methacrylate methosulfate, poly(3-N,N,N-trimethylammonium) propyl chloride. A preferred mordant would be a quarternary ammonium compound.

Surfactants, which may optionally be incorporated into the receiving layer, include fluorosurfactants and non-fluoro surfactants, for example, a fluorosurfactant such as Lodyne® S100 or Zonyl® FSN, or a non-fluoro surfactant such as Olin® 10G or fluorosurfactants such as those described in US-A-2002/0155402, the content of which is incorporated herein by reference. A surfactant incorporated into the receiving layer may be non-ionic, cationic, anionic or amphoteric. Surfactants may be present in the receiving layer for controlling the spread of fluid applied to the surface of the receiver, especially fluorosurfactants, and/or to assist in achieving a good and even coating of the receiving layer during manufacture of the receiver, especially non-fluoro surfactants.

Optionally, the receiving layer may further comprise an amorphous hydrated aluminosilicate, such as an allophane, for the reduction of smearing of an image when a printed receiver is stored at high temperatures and humidities.

Other additional components that may be added include, for example, stabilisers for dyes and/or pigments against degradation by, for example, light or ozone, UV absorbers, sequestering agents, etc.

The receiving layer may also optionally comprise a lightly bound inorganic particulate material, which may be any inorganic particulate material that is capable of providing a degree of porosity to the receiver. Suitable such inorganic particulate materials useful in the receiver according to the present invention include, for example, silica particulate materials such as anionic silica gel, cationic silica gel and colloidal silica, fumed silica, alumina, fumed alumina, titanium oxide, alumina hydrate, pseudo-boehmite, zinc oxide, tin oxide, zirconium dioxide, silica-magnesia, clay, calcium carbonate, calcium oxalate, zinc carbonate, zinc oxalate, aluminium carbonate, aluminium hydroxide, zeolites (such as molecular sieves 3A, 4A, 5A and 13X), bentonite, hectorite, and mixtures thereof. Preferably, the inorganic particulate material is one or more of a silica particulate material, calcium carbonate, an alumina particulate material, such as fumed alumina, or a zeolite. Examples of suitable colloidal silicas include, for example, Nalco® 1115 (4 nm), Ludox® SM-30 (7 nm), Ludox® LS-30 (12 m), Ludox® TM-40 (22 nm), Ludox® AM (~30 nm), Ludoxe TM-30 (~50 nm) and Ludox® PW-50 (~100 nm), and examples of suitable silica gels include anionic silica gel Sylojet® 703A and cationic silica gel Sylojet® 703C. Suitable laydowns of such inorganic particulate material may be, for example, from 1 to 90 g/m$^2$, more preferably from 5 to 75 g/m$^2$ and most preferably from 10 to 60 g/m$^2$. If the receiver is a transparent receiver, the form and amount of any inorganic material used may be limited to preserve the transparent nature of the receiver, for example, a small amount of very fine non-scattering inorganic particulate material may be used.

Inorganic particulate and/or polymer beads may also optionally be incorporated into the receiver in order to modify the surface properties of the receiver to assist in stacking and feeding the receiver into a suitable apparatus such as an ink-jet printer. Typical materials for this purpose include matt beads (silica) or polymer beads, such as PMMA.

According to one embodiment of the invention, the radiation absorbing component is a dye, such as a black or coloured dye or infra-red or ultra-violet absorbing dye (e.g. a sensitising dye). Preferably, the radiation absorbing component is a black or coloured dye and the altered radiation absorbing component is colourless. The absorbance controlling composition preferably comprises one or more compounds capable of disrupting or destroying the radiation absorbing component whereby it loses its particular absorbance properties in becoming an altered radiation absorbing component.

This may be effected by treating a receiver having a radiation absorbing component (e.g. a dye) which is sensitive to oxidation or reduction with a strong oxidising agent or reducing agent (which is preferably stable in water) respectively, whereby the absorbance properties are altered. For example, this could be effected by treating a peroxide-sensitive dye with a peroxide, such as hydrogen peroxide. Another system by which this effect may be achieved is by utilising a coloured metal-ligand complex, such as, for example, cobalt-edta complex, copper-amine complex or copper sulfate, as the radiation absorbing component, and treating the metal-ligand complex with a competing ligand, capable of effectively displacing the complexed ligand to form a new complex which is colourless or a different colour to the original complex. Alternatively, where the metal-ligand complex is susceptible to attack by an acid or base, typically an acid in the case of, for example, cobalt-edta, by treating the metal-ligand complex with an aqueous acid or base solution.

Preferably the method of imaging is essentially irreversible and more preferably is completely irreversible.

Preferably, according to a preferred embodiment, the radiation absorbing component is a dye or pigment or combination of dyes and/or pigments, which dye or pigment has spectral absorbance properties susceptible to alteration on contact with or on reaction with an absorbance controlling composition comprising a complex of sulfur dioxide with a substituted or unsubstituted amine. Suitable such dyes or pigments include sulfite sensitive dyes or pigments.

Suitable sulfite sensitive dyes or pigments include dye and pigments across a range of dye and pigment classes. For example, suitable dyes for use in the receiving layer include sulfite sensitive quinone dyes, barbituric acid and pyrazolo-3 carboxylic acids.

Preferred sulfite-sensitive dyes for use in accordance with one or more embodiments of the present invention include Dyes A-I, which have molecular formulae as set out below.

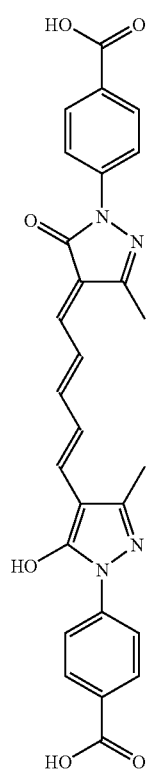

Dye A

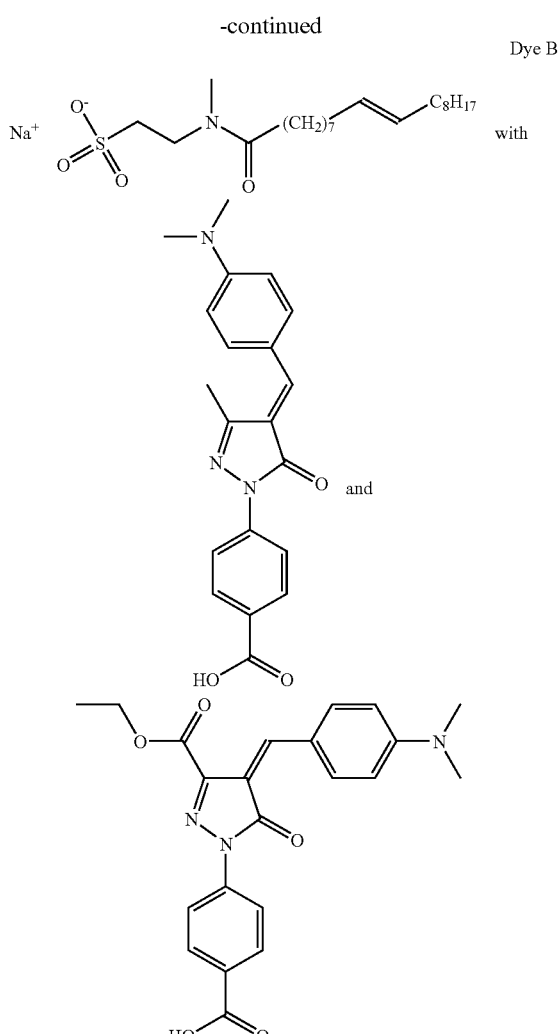

Dye B with and

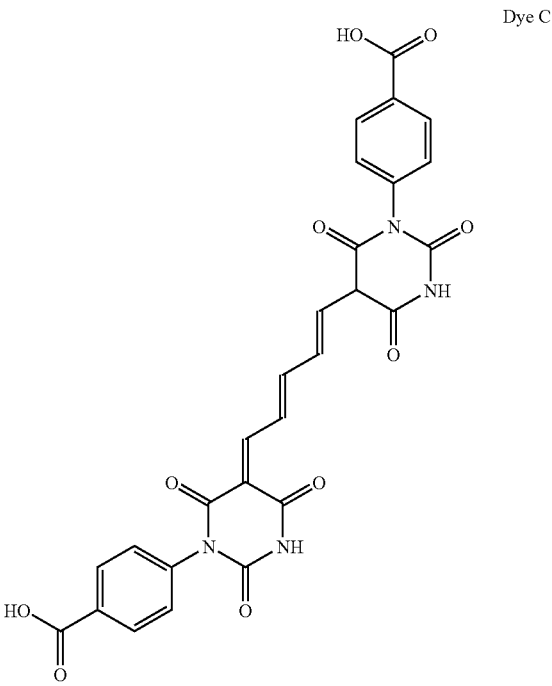

Dye C

Dye D
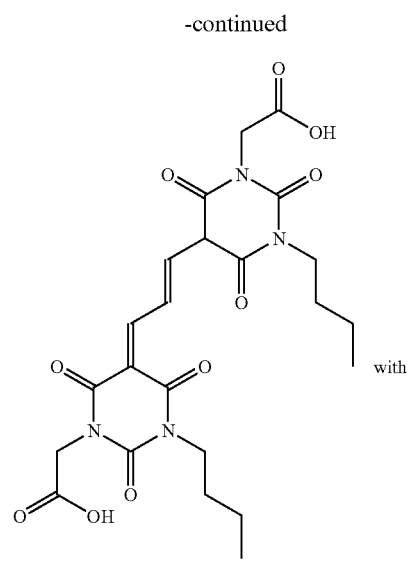
with
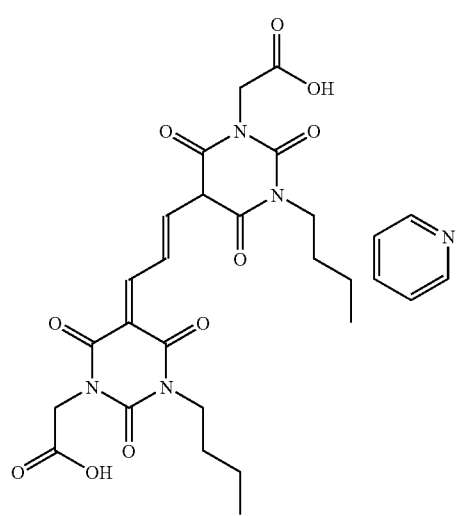
Dye E
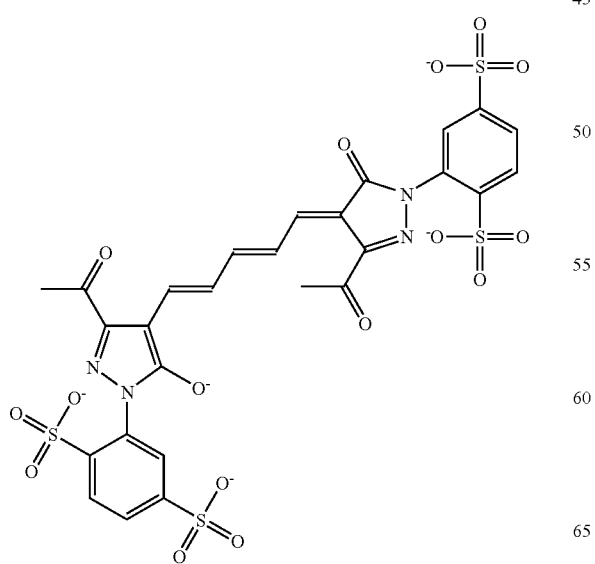
Na+ Na+ Na+ Na+ Na+
Dye F
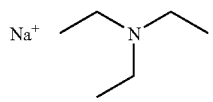
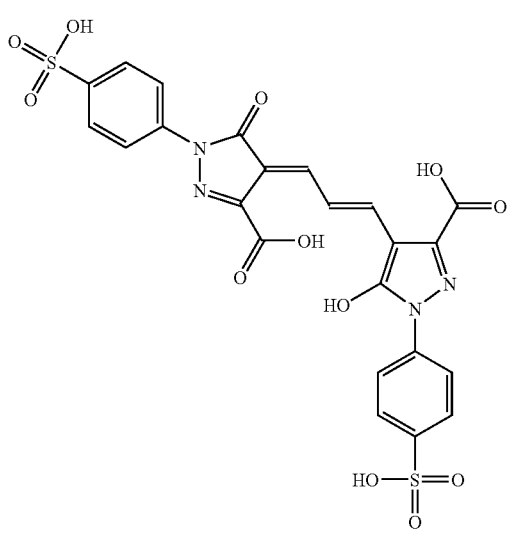
Dye G
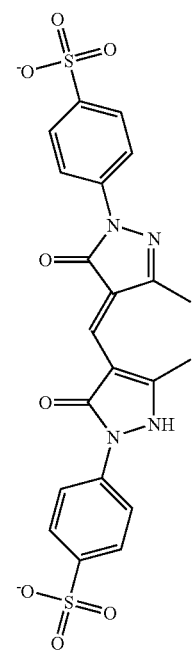
K+ K+
K+ K+ K+ K+
Dye H

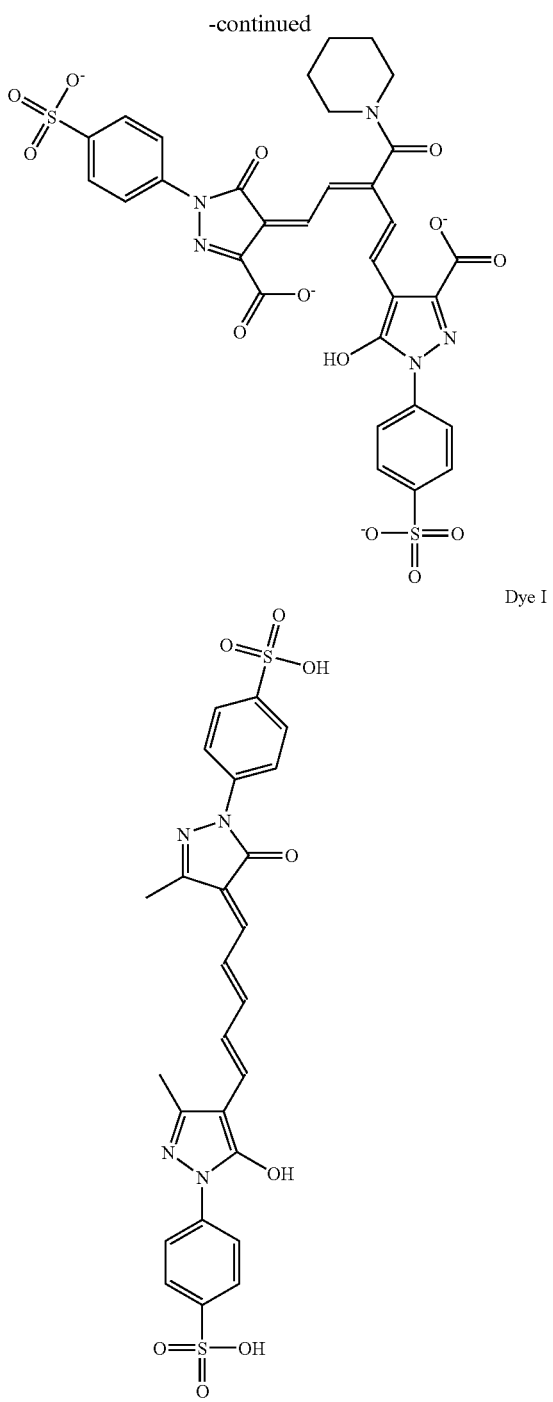

Dye I

Optionally, according to the present embodiment, the receiving layer comprises two or more different layers, one of which is an imaging layer comprising the adsorbant material and the sulfite sensitive dye or pigment. The one or more other layers may be fluid receiving layers to assist in the uptake of carrier fluid from a solution jetted onto the receiver and are preferably non-imaging layers. The non-imaging layers of the receiving layer preferably do not have any sulfite sensitive dye or pigment present for the purpose of imaging and more preferably have no sulfite sensitive dye or pigment present whatsoever. The imaging layer may further comprise any one or any suitable combination of the components discussed above as components suitable for incorporation into the receiving layer. Any or each other layer of the receiving layer may also comprise any of the above mentioned components as appropriate to its purpose.

An imaging layer in a receiver having such a multi-layer structure may be the top or bottom layer of the receiving layer or may be a middle layer having one or more other layers both above and below the imaging layer within the receiving layer.

In another embodiment of the invention, the receiver comprises two or more different radiation absorbing components having the same or different spectral absorbance properties and each being susceptible to alteration to form different altered radiation absorbing components upon contact with corresponding absorbance controlling compositions. Preferably, the altered radiation absorbing components are colourless.

For example, in accordance with the present embodiment, the receiver may comprise a first radiation absorbing component having a first absorbance profile susceptible to alteration by a first absorbance controlling composition to form a first altered radiation absorbing component; a second radiation absorbing component having a second absorbance profile susceptible to alteration by a second absorbance controlling composition to form a second radiation absorbing component; and a third radiation absorbing component having a third absorbance profile susceptible to alteration by a third absorbance controlling composition to form a third radiation absorbing component, which first, second and third absorbance profiles are preferably different from, one or both of the other two absorbance profiles and the first, second and third altered radiation absorbing components are each colourless. Preferably, each of the first, second and third absorbance controlling compositions are different and are capable of altering the absorbance profile only of the respective first, second or third radiation absorbing component. In that case, each corresponding radiation absorbing component and absorbance controlling composition are a selective deletion set.

Preferably, the absorbance profiles of each of the first second and third radiation absorbing components correspond to cyan, magenta and yellow spectral regions respectively. Thereby, by the method according to this embodiment, application of the first, second and third absorbance controlling compositions to the receiver in accordance with a desired image in appropriate amounts may lead to a colour image.

Optionally, in accordance with the present embodiment, the receiver may comprise one or more additional radiation absorbing component(s) having absorbance profiles susceptible to alteration in the same way as the before upon contact with one or more further absorbance controlling compositions, and preferably comprises a black component.

In order for selective control or deletion of the density of colour provided by each of the radation absorbing components of the present embodiment, each radiation absorbing component and corresponding absorbance controlling composition set should be selected such that the control of density of one colour does not significantly affect the control of density of the other.

If, for example a cyan dye which is sulfite-sensitive is selected as the first radiation absorbing component and a suitable sulfur-dioxide complex solutions selected as the first absorbance controlling composition, the second and third radiation absorbing components should be selected such that they are not sulfite-sensitive.

Suitable selective deletion sets for use according to this embodiment include, for example, a sulfite-sensitive dye and a sulfur dioxide complex as described above in respect of another embodiment of the invention, peroxide-sensitive dyes and peroxide, and persulfate-sensitive dyes and persulfate.

The adsorbant material may be present in any suitable amount for the particular utility, which may depend on the amount and type of radiation absorbing component (e.g. dye or pigment) incorporated into the receiving layer and on the absorbant properties of the particular material, e.g. polymer, used. A laydown of adsorbant onto a support may be, for example, up to 40 g/m$^2$, preferably from 0.5–20 g/m$^2$, and most preferably 1–10 g/m$^2$, which may be coated as a single layer or in two or more layers. Such amounts would be particularly useful if, for example, the adsorbant material was PVA or gelatin.

Each radiation absorbing component (e.g. dye or pigment) may be present in the imaging layer in any amount suitable for achieving the highest density required in an image at the particular absorbance of that component.

The amount of a dye or pigment used in the imaging layer depends upon the particular dye or pigment used. For example, the imaging layer may comprise of from 0.05 to 10 g/m$^2$ of dye, preferably 0.1 to 1 g/m$^2$ and more preferably from 0.25 to 0.5 g/m$^2$.

The receiving layer may be coated onto the support by any suitable method such as, for example, curtain coating, bead coating, air knife coating or any other suitable method. Typically, in bead coating, a set-up is used in which a multi-layer arrangement of liquids is applied to a moving web via a hopper. The radiation absorbing component (e.g. dye or pigment) may be incorporated into the receiving layer, or imaging layer, by mixing or dispersing the radiation absorbing component (e.g. dye or pigment) as appropriate with an aqueous solution/dispersion of the adsorbant material and any other components that may be incorporated into the receiving layer at the coating stage.

Optionally, the receiver may comprise additional layers such as a subbing layer, between the support and the receiving layer, in order to improve adhesion of the receiving layer to the support. Alternatively, the support may be subjected to a corona discharge to improve adhesion of the receiving layer.

The receiver may further comprise one or more polymer underlayers for the purpose of, for example, carrying any additional dyes or addenda. Optionally, a polymer underlayer, a non-imaging layer in the receiving layer, a backing layer located on the non-imaging side of a transparent receiver and/or an imaging layer may comprise a dye, which is not sensitive to any of the one or more absorbance controlling compositions that may be applied to affect the density of each one or more of the radiation absorbing components in the imaging layer (e.g. where one of the radiation absorbing components in the imaging layer is a sulfite-sensitive dye, the additional dye should be non sulfite-sensitive), to improve the visual appearance of the image formed on the receiver. For example, a blue dye might be utilised to improve the visual contrast of the image formed. Alternatively, especially when the receiver is a transparent receiver for use in reproducing X-ray images, a yellow dye may be incorporated in order to cause the image formed to have a similar overall appearance to that of a traditional X-ray image. Where such a dye is to be used on the non-imaging side of a transparent receiver, it need not necessarily be insensitive to the absorbance controlling composition (e.g. sulfite solution).

The sulfur dioxide complex used as an absorbance controlling composition according to a preferred method of the present invention is typically applied in the form of a complex with one or more non-solid substituted or unsubstituted amines, either neat (i.e. in one or more of the amines as solvent) or in a solution, which is typically an aqueous solution. The solution of the sulfur dioxide complex may be prepared by blowing sulfur dioxide gas through a liquid amine or solution thereof, typically an aqueous solution, or by mixing an aqueous solution of sulfur dioxide with an amine, typically also in aqueous solution.

Suitable amines for use in forming a complex with the sulfur dioxide should be capable of forming a complex with sulfur dioxide such that a sulfite species is formed, at least transiently or in equilibrium. The amine should be anionic or amphoteric, preferably anionic, and preferably is alkaline.

Preferably, the amines used to form a complex with sulfur dioxide are secondary amines, tertiary amines or substituted or unsusbstituted imines, more preferably tertiary amines or substituted imines and most preferably tertiary amines. Optionally, the amines or imines are present as polymers, for example ethyleneimine polymer having a molecular weight of, for example, 500 to 750,000 such as a molecular weight of about 600 or about 600,000.

Suitable substituent groups on the substituted amines or imines for use in the complex with sulfur dioxide in accordance with the present invention include alkyl, hydroxyalkyl, aminoalkyl, amidoalkyl and alkoxy. Preferred substituents include, for example, ethyl or hydroxyethyl groups.

Examples of non-solid substituted or unsubstituted amines suitable for use in accordance with the present are, for example, diethanolamine, triethanolamine, triethylamine, 2-methylaminoethanol, ethyleneimine polymer (e.g. having a molecular weight of 600 or of 600,000)

Optionally, where a suitable amine is incorporated in one of the layers of the receiver, preferably the imaging layer or a layer adjacent thereto, for example where the adsorbant material in the imaging layer is a suitable amine such as poly(ethylene imine), the sulfur dioxide-amine complex may be formed in situ in the receiver and the receiver is treated with the sulfur dioxide-amine complex simply by applying a solution of sulfur dioxide according to the desired image.

In order to maximise the resolution achievable using the solution, a surfactant may optionally be added. Preferably, sufficient surfactant is added to the solution to provide a viscosity in the range 0.5–20×10$^{-3}$ Ns/m$^2$, preferably in the range 1.5–12×10$^{-3}$ Ns/m$^2$, which amount of surfactant necessary will depend upon the choice of surfactant, the precise nature of the complex formed, which depends upon the relative amount of, for example, sulfur dioxide and amine and on the choice of amine, and on the intended application.

Suitable surfactants include, for example, trisiloxane surfactants such as Silwet™ L7607, a nonylphenyl polyethylene glycol type surfactant such as Triton™ X-100 or an alkyl sulphoxy substituted butane dioc acid such as Aerosol OT™.

For example, when using a diethanolamine-sulfur dioxide complex, 2 g/l of Silwet™ L7607 may be utilised and its viscosity adjusted by adding different concentrations of complex to be in the region of 1×10$^{-3}$ Ns/m$^2$ (see Example 7 below).

The solvent or carrier liquid of the solution may be any suitable solvent and is preferably water or an aqueous alcohol solution.

Other optional components of the solution may be, for example, humectants, organic solvents, thickeners, preservatives and the like.

The method and/or composition of the present invention may be utilised, as mentioned above, in the manufacture of printed circuit boards providing a simple, fast and efficient fluid jet printing method of manufacturing printed circuit boards. As alluded to above, the printed circuit board may be manufactured by first generating a mask by treating a receiver according to a printed circuit board pattern with an absorbance controlling composition (such as a complex of sulfur dioxide with a substituted or unsubstituted amine), wherein the receiver comprises a receiving layer which comprises a radiation absorbing component (e.g. a dye or pigment) which causes the receiver to be substantially opaque and which have certain spectral absorbance properties susceptible to alteration on contact with the absorbance controlling composition, whereby the spectral absorbance properties of the radiation absorbing component on the receiver are correspondingly altered by the composition causing the receiver to become transmissive according to the printed circuit board pattern. A pre-sensitized printed circuit board substrate coated in a photoresist may then be exposed through the mask and then processed to form a printed circuit board having a desired track pattern. Alternatively, a printed circuit board may be manufactured by coating an unimaged printed circuit board with a receiving layer comprising a radiation absorbing component (e.g. dye or pigment) having certain non-transmissive spectral absorbance properties which are capable of being changed to certain transmissive spectral absorbance properties (e.g. transmissive to the ultra-violet region of the spectrum) on contact with an appropriate absorbance controlling composition (e.g. a complex of sulfur dioxide with a substituted or unsubstituted amine) and treating the coated printed circuit board with the composition according to a printed circuit board pattern to form a mask on the printed circuit board. This may then be exposed and the coating optionally removed before or during processing of the exposed printed circuit board to generate a printed circuit board having a desired track pattern.

EXAMPLES

The invention will now be described, without limitation, with reference to the following examples.

Example 1

A receiver was prepared by hand coating an aqueous solution of a pelloid dye (Dye A) dispersed in gelatin on to an Estar® film (100 μm PET) support with a wet laydown thickness of about 24 μm and the coated support dried to give Receiver I, having a laydown of 0.5 g/m² Dye A and 2.0 g/m² gelatin.

A solution of about 30 g/l diethanolamine-sulphur dioxide complex was made up and applied to areas of Receiver I with a paint brush. The areas that received the solution were decolourised.

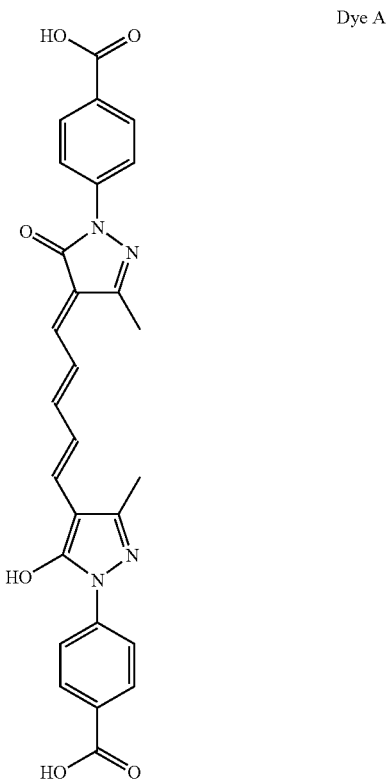

Dye A

Example 2

A receiver (Receiver II) was made according to the method of Example 1, except that a coating only 12 μm wet thickness was formed on the support, corresponding to a laydown of 0.25 g/m² of Dye A and of 1.0 g/m² gelatin.

A solution (Solution 1) was made up as follows.

| | |
|---|---|
| Dethanolamine-SO₂ complex | 1 g |
| water | 20 g |
| Silwet L-7607 ™ surfactant | 1 drop |

An HP Deskjet® '26 cartridge was emptied of ink and washed to remove traces of ink. It was then charged with the Solution 1, which was first filtered through a 0.45 μm Whatran™ filter.

The cartridge was then inserted in a HP Deskjet® 420 ink-jet printer and checked for liquid flow by writing the cleaning pattern (press change ink-cartridge button whilst turning on power) onto copier paper. The solution wetted the paper in expected streaks.

Figure 7:
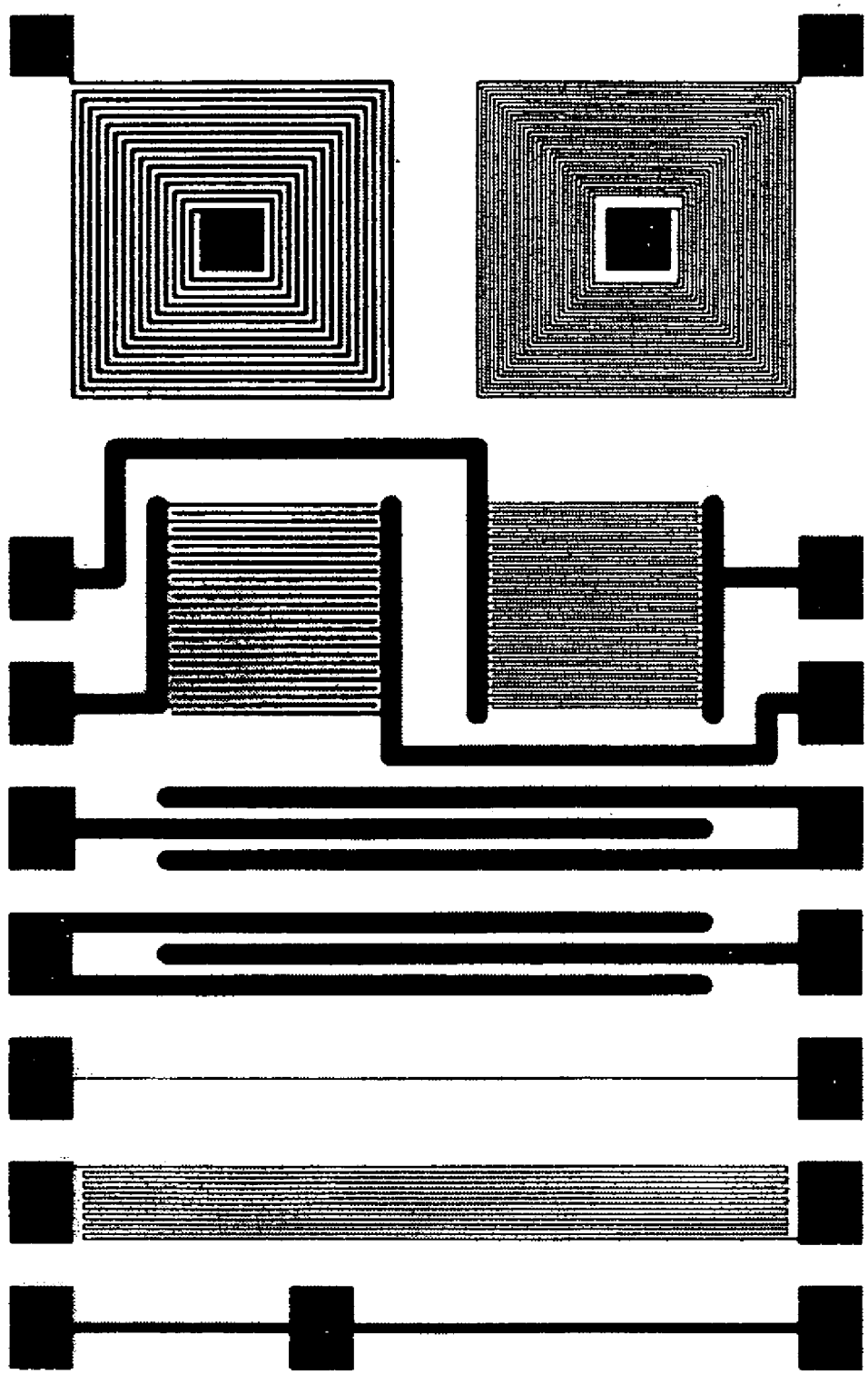
FIG. 7 shows test pattern images of printed circuit board coils generated according to the method of the present invention.

An image of a printed circuit board coil was set up in an imaging package on a suitable PC. This image was sent as 'econoprint' to the printer and a corresponding pattern of the solution was jetted onto Receiver II having dimensions of about 70×125 mm, fed through the manual slot in the back of the printer and the image written to the material. An image of the coil could be clearly seen (see FIG. 7, for example).

Example 3

A wedge image file was made up in Adobe Photoshop®. This was made as single pixel by 3 pixel wide images with steps corresponding to image numbers 0, 51, 102, 153, 204 and 255 in red green and blue to give neutral densities. This was then converted to the printer resolution of 150 dpi using 'nearest neighbour' interpolation to retain the wedge. This image was printed onto the coated material of Example 1 (Receiver I) using the Solution 1 described in Example 2 above. After standing for 30 seconds to allow the reaction to reach completion and the ink to dry, the neutral density of the image was read using a densitometer. A graph of the density (×100) versus image number for this coating is shown in FIG. 1. The value for pixel density provided in Adobe Photoshop® are inversely proportional to the actual representation (i.e. pixel number 255=colourless). Therefore, in FIG. 1, the value of 0 for pixel value corresponds to the most fluid jetted and the value of 255 for pixel value corresponds to no fluid jetted. The visible density scale on the Y-axis corresponds to the actual measured visible density.

As can be seen from the graph in FIG. 1, the fluid jetted onto the receiver the lesser the density (i.e. the more fluid jetted, the more dye is spectrally altered).

Example 4

A receiver (Receiver III) was prepared according to the method used to prepare Receiver II (see Example 2) except that the dispersion of Dye A and gelatin was coated onto an Ektacolor® resin coated paper support.

The wedge image of Example 3 was printed onto Receiver III using Solution I by the same method as that of Example 2. The resulting density versus image values are shown in FIG. 2.

Figure 2:
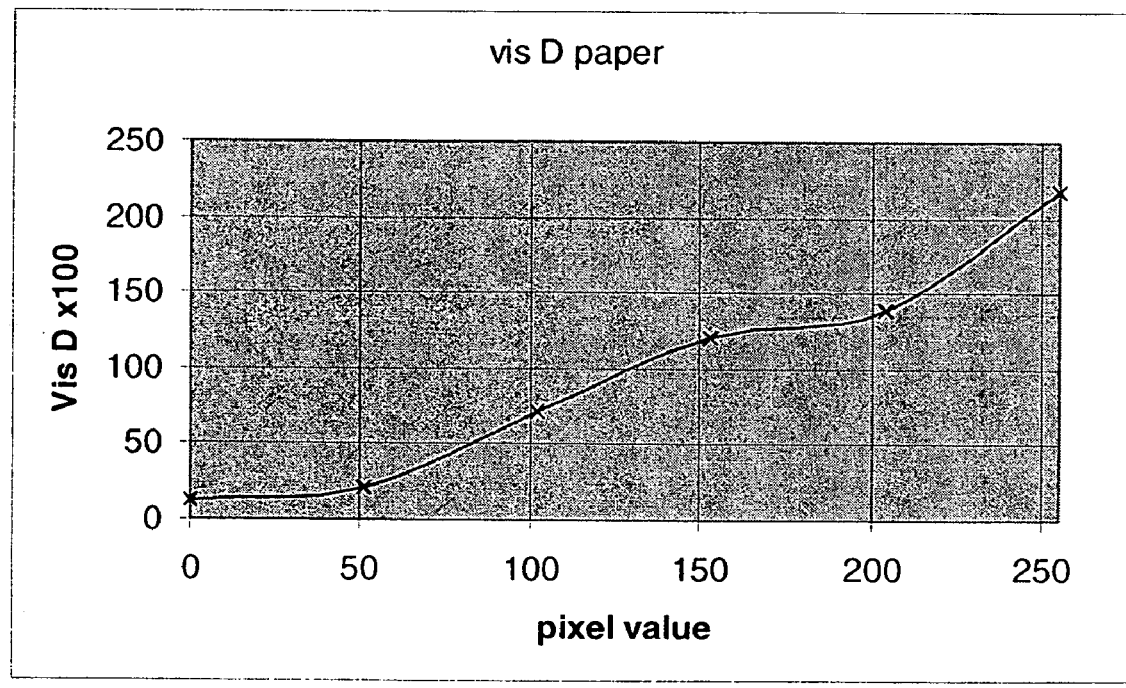
FIG. 2 shows a graph of pixel value against measured visible density for Solution 1 applied to Receiver III (of Example 4) according to the Adobe Photoshop® wedge image of Example 3.

As can be seen from the graph in FIG. 2, the fluid jetted onto the receiver the lesser the density (i.e. the more fluid jetted, the more dye is spectrally altered).

Example 5

A number of receivers (Film 5 to Film 8 and Paper 5 to Paper 8) were prepared by coating various coating solutions of Dye A and polyvinyl alcohol (PVA) as binder onto Estar® film support and Ektacolor® resin coated paper (polyethylene coated paper support) to give coated supports having the coating laydowns as set out in Table 1.

TABLE 1

Coating composition of Films 5–8 and Papers 5–8

| Receiver | Support | Binder | coating wt. of Dye A (g/m2) | coating wt. of binder (g/m2) |
|---|---|---|---|---|
| Film 5 | Estar ® film | PVA | 0.6 | 4.0 |
| Film 6 | Estar ® film | PVA | 0.6 | 8.0 |
| Film 7 | Estar ® film | PVA | 0.9 | 4.0 |
| Film 8 | Estar ® film | PVA | 0.9 | 8.0 |
| Paper 5 | Ektacolor ® resin coated paper | PVA | 0.6 | 4.0 |
| Paper 6 | Ektacolor ® resin coated paper | PVA | 0.6 | 8.0 |
| Paper 7 | Ektacolor ® resin coated paper | PVA | 0.9 | 4.0 |
| Paper 8 | Ektacolor ® resin coated paper | PVA | 0.9 | 8.0 |

A wedge image was printed as described in Example 3 using Solution 1, of Example 2.

Figure 3:
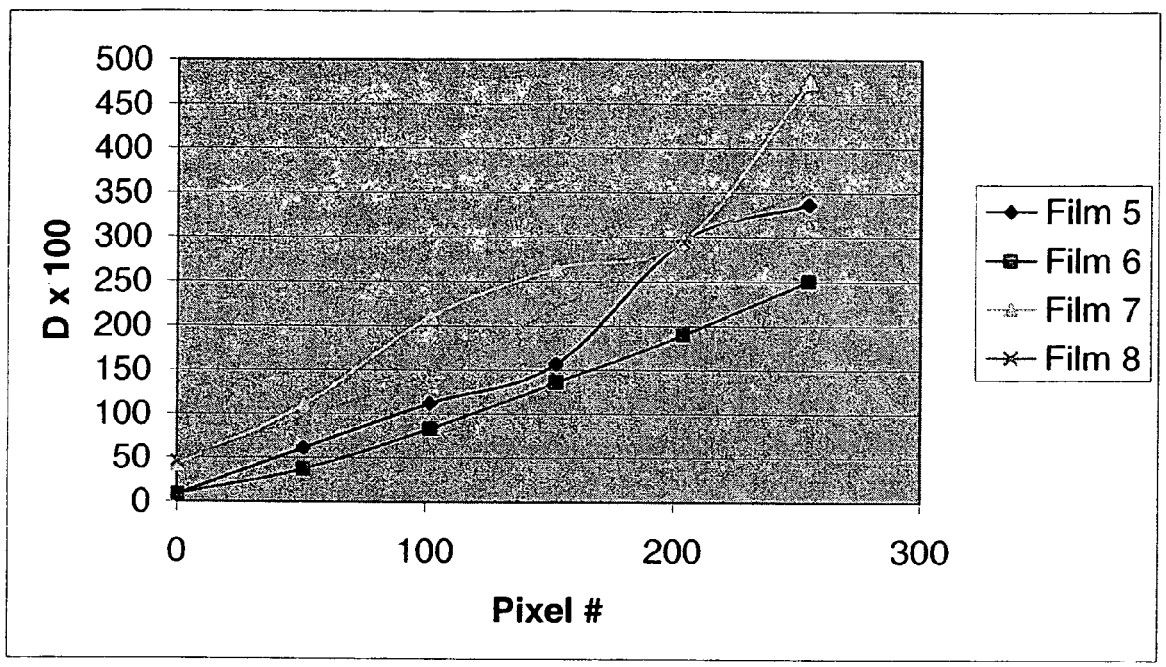
FIG. 3 shows a graph of pixel value against measured visible density for Solution 1 applied to Films 5–8 (of Example 5) according to the Adobe Photoshop® wedge image of Example 3.
Figure 4:
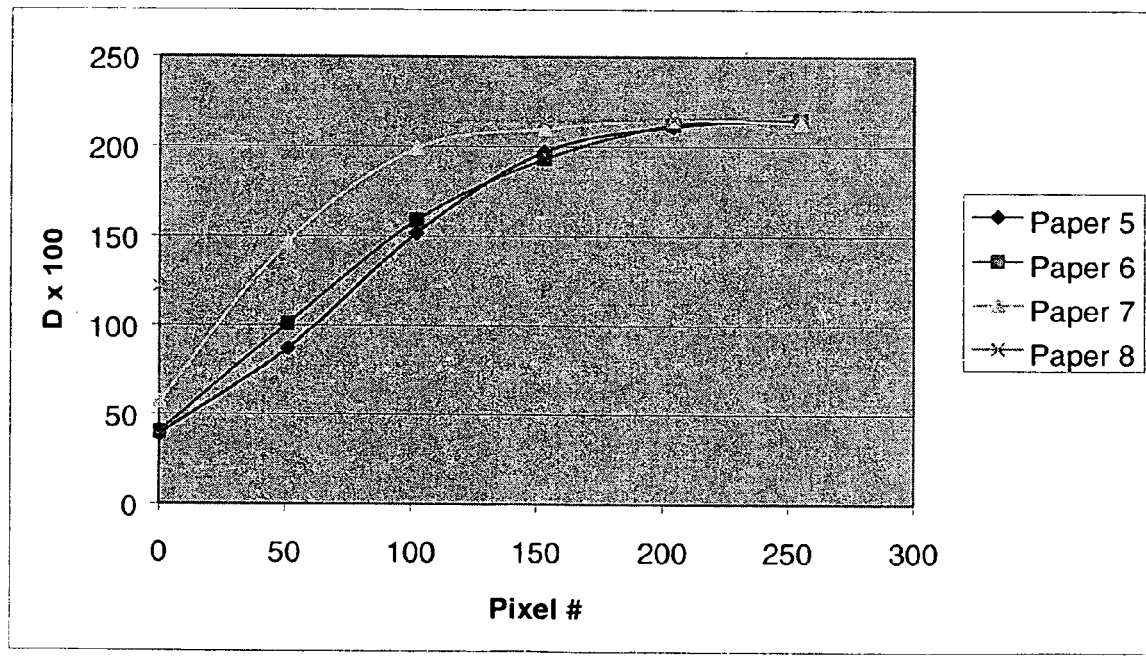
FIG. 4 shows a graph of pixel value against measured visible density for Solution 1 applied to Papers 5–8 (of Example 5) according to the Adobe Photoshop® wedge image of Example 3.

The resulting 'sensitometry' is shown in FIG. 3 for the coated film supports and in FIG. 4 for the coated paper supports.

As can be seen from the graph in FIG. 3, the fluid jetted onto the receiver the lesser the density (i.e. the more fluid jetted, the more dye is spectrally altered) in each case.

Example 6

A number of receivers (Receivers 9–16) were prepared according to the method of Example 1, except that Dyes B to I were used respectively in place of Dye A and the respective dispersions were coated such that a coating with 0.5 g/m² dye and 1 g/m² gelatin was formed.

Dyes B to I have the following molecular formulae.

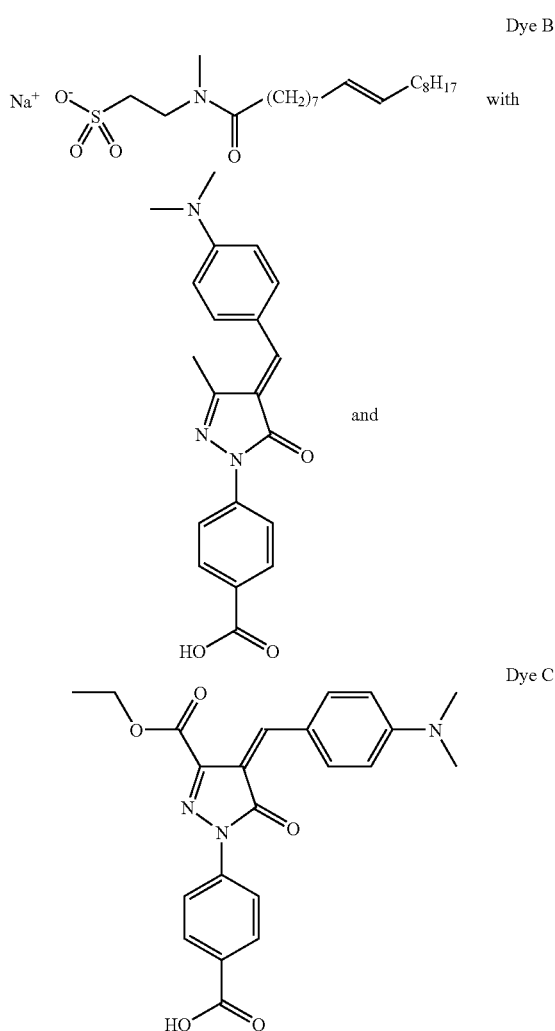

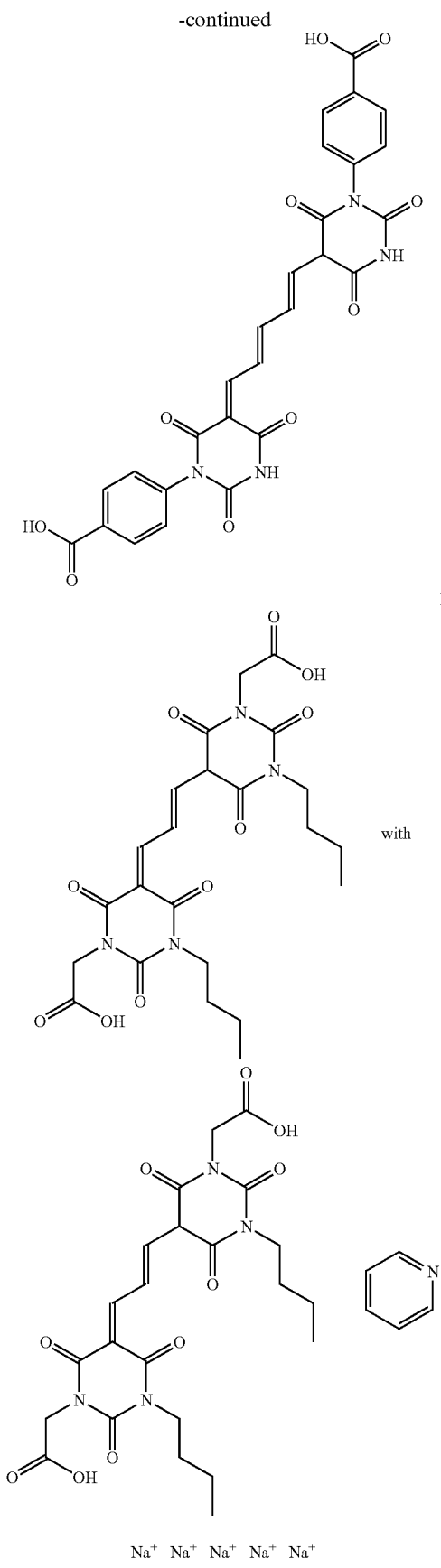
Dye D
with
Dye E
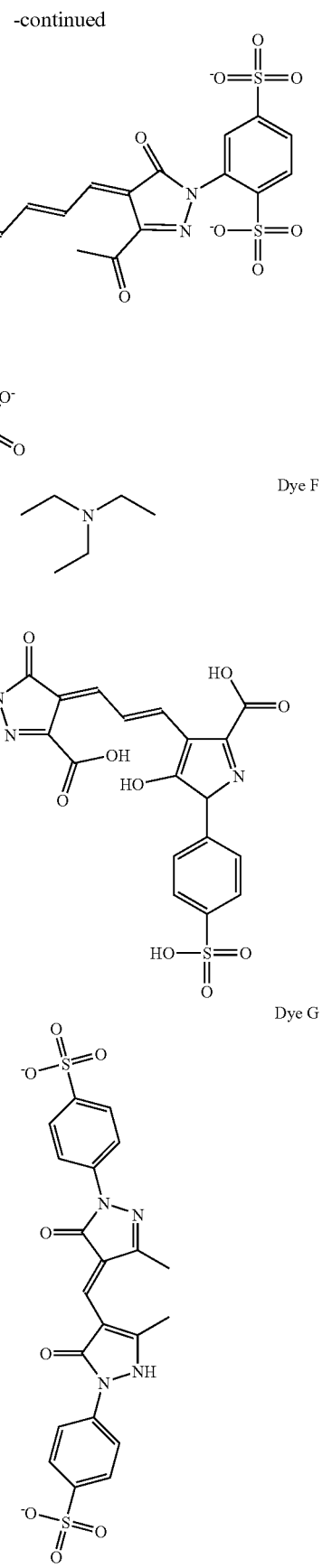
Dye F
Dye G

-continued

Dye H

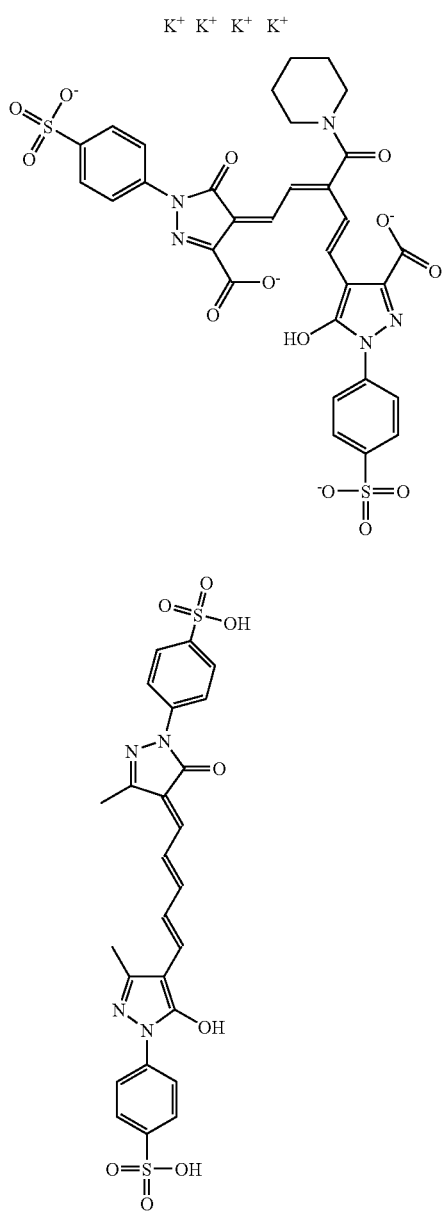

Dye I

All the above receivers were decoloured with the Diethyleneamine-SO₂ solution when treated according to the method in Example 1.

Example 7

A number of solutions of sulfur dioxide-amine complexes were prepared, keeping the concentration of SO₂ the same (at 1.6 g/100 ml) and using varying amines and varying concentrations thereof as set out below. The complexes were prepared in situ using an approximately 5% solution of sulfur dioxide solution (available from Fluka). The viscosity of each solution was measured using an Oswald viscometer (calibrated with water at 20° C.).

Solution 2

| | |
|---|---|
| sulfur dioxide solution (5%) | 33 ml |
| triethanolamine | 20 ml |
| water to | 100 ml |
| Silwet L7606 | 2 drops |

Viscosity = 1.54 × 10−3 Ns/m2

Solution 3

| | |
|---|---|
| sulfur dioxide solution (5%) | 33 ml |
| triethylamine | added until pH = 9~7 ml |
| water to | 100 ml |
| Silwet L7606 | 2 drops |

Viscosity = 1.19 × $10^{-3}$ Ns/m2

Solution 4

| | |
|---|---|
| sulfur dioxide solution (5%) | 33 ml |
| 2 methylaminoethanol | 10 ml |
| water to | 100 ml |
| Silwet L7606 | 2 drops |

Viscosity = 1.38 × $10^{-3}$ Ns/m2

Solution 5

| | |
|---|---|
| sulfur dioxide solution (5%) | 33 ml |
| ethyleneimine polymer (mw600) | 10 ml |
| water to | 100 ml |
| Silwet L7606 | 2 drops |

Viscosity = 2.00 × $10^{-3}$ Ns/m2

Solution 6

| | |
|---|---|
| sulfur dioxide solution (5%) | 33 ml |
| ethyleneimine polymer (mw600,000) | 10 ml |
| water to | 100 ml |
| Silwet L7606 | 2 drops |

Viscosity = 12.06 × $10^{-3}$ Ns/m2

Figure 5:
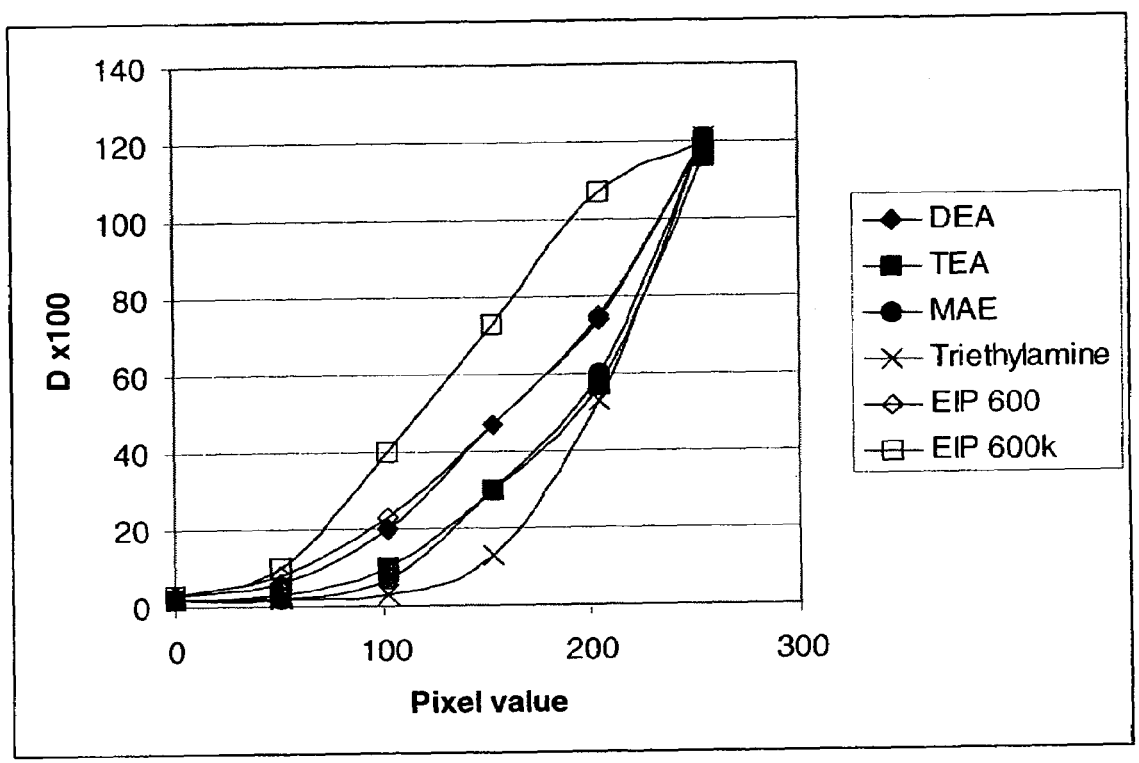
FIG. 5 shows a graph of pixel value against measured visible density for Solutions 1–6 applied to Film 5 of Example 5 according to the Adobe Photoshop® wedge image of Example 3.
Figure 6:
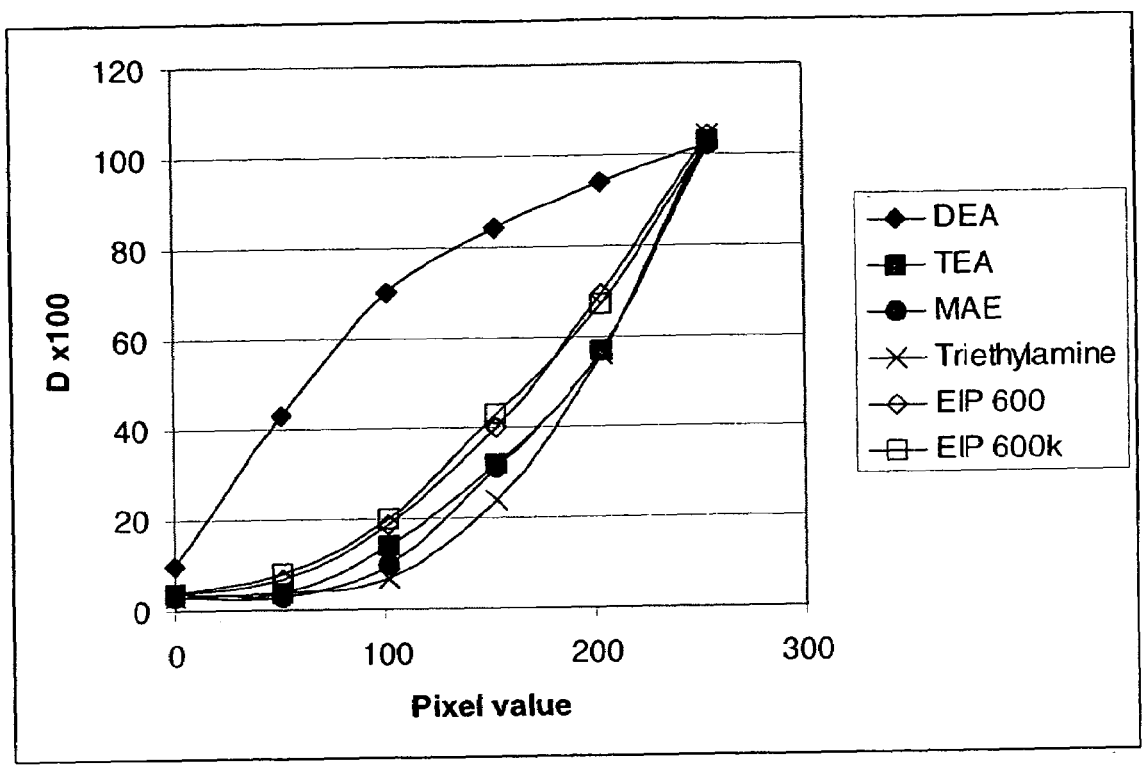
FIG. 6 shows a graph of pixel value against measured visible density for Solutions 1–6 applied to Paper 5 of Example 5 according to the Adobe Photoshop® wedge image of Example 3.

Each of Solutions 1 to 6 were used to print the wedge image of Example 3 on Film 5 and Paper 5 (from example 5). The sensitometry resulting from the use of this combination of solution and receiver to print the image is presented in FIGS. 5 and 6.

The invention claimed is:
1. A method of imaging comprising the steps of
providing a receiver having a continuous homogeneous coverage of at least one radiation absorbing component, which is a black or coloured dye or pigment, having pre-determined spectral absorbance properties susceptible to alteration to form an altered radiation absorbing component upon contact with at least one absorbance controlling composition; and
treating the receiver with an absorbance controlling composition according to a desired image whereby the spectral properties of the radiation absorbing component are altered such that the desired image is formed.

2. A method as claimed in claim 1, wherein the radiation absorbing component is black or coloured and the altered radiation absorbing component is colourless.

3. A method of imaging comprising the steps of
providing a receiver having at least one radiation absorbing component having pre-determined spectral absorbance properties susceptible to alteration to form an altered radiation absorbing component upon contact with at least one absorbance controlling composition; and treating the receiver with an absorbance controlling composition according to a desired image whereby the spectral properties of the radiation absorbing component are altered such that the desired image is formed, wherein the absorbance controlling composition comprises a complex of sulfur dioxide with a non-solid substituted or unsubstituted amine.

4. A method as claimed in claim 3, wherein the receiver comprises a continuous homogeneous coverage of the radiation absorbing component.

5. A method of imaging comprising the steps of
providing a receiver having at least one radiation absorbing component having pre-determined spectral absorbance properties susceptible to alteration to form an altered radiation absorbing component upon contact with at least one absorbance controlling composition; and treating the receiver with an absorbance controlling composition according to a desired image whereby the spectral properties of the radiation absorbing component are altered such that the desired image is formed, wherein the radiation absorbing component is a sulfite-sensitive quinone dye.

6. A method of imaging as claimed in claim 1, wherein the black or coloured dye or pigment is sensitive to oxidation or reduction and the absorbance controlling composition is an oxidizing or reducing agent.

7. A method of imaging as claimed in claim 1, wherein the radiation absorbing component is a sulfite-sensitive dye.

8. A method of imaging as claimed in claim 5, wherein the receiver comprises a continuous homogenous coverage of the radiation absorbing component.

9. A method of imaging as claimed in claim 5, wherein the absorbance controlling composition comprises a complex of sulfur dioxide with a non-solid substituted or unsubstituted amine.

10. A method of imaging as claimed in claim 1, wherein the absorbance controlling composition comprises a complex of sulfur dioxide with a non-solid substituted or unsubstituted amine.

11. A method of imaging as claimed in claim 3, wherein the substituted or unsusbstituted amine is selected from one or more of diethanolamine, triethanolamine, triethylamine, 2-methylaminoethanol and ethyleneimine polymer.

12. A method of imaging as claimed in claim 1, wherein the dye or pigment is highly absorbant to light of wavelengths across the visible spectrum.

13. A method of imaging as claimed in claim 1, wherein the absorbance controlling composition is a jettable fluid.

14. A method of imaging as claimed in claim 13, wherein the absorbance controlling composition comprises a solution applied to the receiver in accordance with the desired image by an ink-jet printer.

15. A method of imaging as claimed in claim 14, wherein the absorbance controlling composition comprises a surfactant to control the viscosity of the solution.

16. A method of imaging as claimed in claim 1, wherein the receiver comprises an adsorbent material.

17. A method of imaging as claimed in claim 1, wherein the receiver comprises an adsorbent material, which is a swellable polymer.

18. A method of imaging as claimed in claim 1, wherein the receiver further comprises a sulfite-insensitive dye to enhance the visual appearance of the image formed.

19. A method of imaging as claimed in claim 18, wherein the sulfite-insensitive dye is a blue or yellow dye.

20. A method of imaging as claimed in claim 1, wherein the receiver is such that it is substantially opaque prior to application of the absorbance controlling composition and which on application of the absorbance controlling composition to a position on the receiver becomes translucent or transmissive at that position.

21. A method of imaging as claimed in claim 20, the degree of translucency or transmittance of the receiver at any particular position corresponds to the amount of the absorbance controlling composition applied to the receiver at that position.

22. A method of imaging as claimed in claim 20, wherein the receiver is treated with the absorbance controlling composition according to a printed circuit board pattern, causing the receiver to become transmissive according to the printed circuit board pattern to form a mask for use in the manufacture of printed circuit boards.

23. A method of imaging as claimed in claim 22, further comprising exposing a pre-sensitized printed circuit board substrate coated in a photoresist through the formed mask and processing said exposed printed circuit board substrate to form a printed circuit board having a desired track pattern.

* * * * *